United States Patent
Guo et al.

(10) Patent No.: US 7,443,707 B2
(45) Date of Patent: Oct. 28, 2008

(54) MAGNETIC RANDOM ACCESS MEMORY ARRAY WITH FREE LAYER LOCKING MECHANISM AND METHOD OF ITS USE

(75) Inventors: Yimin Guo, San Jose, CA (US); Po-Kang Wang, San Jose, CA (US); Xizeng Shi, Fremont, CA (US); Tai Min, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 29 days.

(21) Appl. No.: 11/732,073

(22) Filed: Apr. 2, 2007

(65) Prior Publication Data

US 2007/0184561 A1 Aug. 9, 2007

Related U.S. Application Data

(62) Division of application No. 10/818,581, filed on Apr. 6, 2004, now Pat. No. 7,211,874.

(51) Int. Cl.
*G11C 11/00* (2006.01)
(52) U.S. Cl. .................. 365/130; 365/232; 365/66; 257/421
(58) Field of Classification Search ............. 365/232, 365/130, 66; 257/421
See application file for complete search history.

(56) References Cited

U.S. PATENT DOCUMENTS

| | | | |
|---|---|---|---|
| 5,650,958 | A | 7/1997 | Gallagher et al. |
| 5,841,692 | A | 11/1998 | Gallagher et al. |
| 6,166,948 | A | 12/2000 | Parkin et al. |
| 6,211,090 | B1 | 4/2001 | Durlam et al. |
| 6,430,085 | B1 | 8/2002 | Rizzo |
| 6,480,412 | B1 | 11/2002 | Bessho et al. |
| 6,555,858 | B1 | 4/2003 | Jones et al. |
| 6,576,969 | B2 | 6/2003 | Tran et al. |
| 6,593,608 | B1 | 7/2003 | Sharma et al. |
| 6,597,049 | B1 | 7/2003 | Bhattacharyya et al. |
| 6,661,688 | B2 | 12/2003 | Bloomquist et al. |
| 2002/0034094 | A1 | 3/2002 | Saito et al. |
| 2004/0089904 | A1 | 5/2004 | Bhattacharyya et al. |
| 2004/0233760 | A1 | 11/2004 | Guo et al. |

*Primary Examiner*—Douglas M Menz
(74) *Attorney, Agent, or Firm*—Saile Ackerman LLC; Stephen B. Ackerman

(57) ABSTRACT

A method of using an MTJ MRAM cell element having two magnetization states of greater and lesser stability. During switching, the free layer is first placed in the less stable state by a word line current, so that a small bit line current can switch its magnetization direction. After switching, the state reverts to its more stable form as a result of magnetostatic interaction with a SAL (soft adjacent layer), which is a layer of soft magnetic material formed on an adjacent current carrying line, which prevents it from being accidentally rewritten when it is not actually selected and also provides stability against thermal agitation.

2 Claims, 3 Drawing Sheets

MAGNETIC RANDOM ACCESS MEMORY ARRAY WITH FREE LAYER LOCKING MECHANISM AND METHOD OF ITS USE

This is a Divisional Application of U.S. patent application Ser. No. 10/818,581, filed on Apr. 6, 2004, now U.S. Pat. No. 7,211,874 which is herein incorporated by reference in its entirety, and assigned to a common assignee.

BACKGROUND OF THE INVENTION

1. Field of the Invention

This invention relates to the design and fabrication of a magnetic tunnel junction (MTJ) MRAM array, particularly to a design for locking (creating a stable magnetization state) un-selected array devices and unlocking (creating a less stable magnetization state) selected array devices.

2. Description of the Related Art

The magnetic tunnel junction (MTJ) basically comprises two electrodes, which are layers of ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, however, depending on the availability of tunneling states with different electron spin orientations. Thus, the overall tunneling current will depend on the number of spin-up vs. spin-down electrons, which in turn depends on the orientation of the electron spin relative to the magnetization direction of the ferromagnetic layers. Thus, if these magnetization directions are varied for a given applied voltage, the tunneling current will also vary as a function of the relative directions. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel (low resistance) or antiparallel (high resistance) configurations (writing data) and that these two configurations can be sensed by tunneling current variations or resistance variations (reading data). In practice, the free ferromagnetic layer can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of current carrying lines called word lines and bit lines. When both lines are activated, the device is written upon, ie, the magnetization direction of its free layer is changed. When only one line is activated, the resistance of the device can be sensed, so the device is effectively read. Such an MTJ device is provided by Gallagher et al. (U.S. Pat. No. 5,650,958), who teach the formation of an MTJ device with a pinned ferromagnetic layer whose magnetization is in the plane of the layer but not free to rotate, together with a free magnetic layer whose magnetization is free to rotate relative to that of the pinned layer, wherein the two layers are separated by an insulating tunnel barrier layer.

In order for the MTJ MRAM device to be competitive with other forms of DRAM, it is necessary that the MTJ be made very small, typically of sub-micron dimension. Parkin et al. (U.S. Pat. No. 6,166,948) teaches the formation of an MTJ MRAM cell in which the free layer is formed of two antiparallel magnetized layers separated by a spacer layer chosen to prevent exchange coupling but to allow direct dipole coupling between the layers. The free layer thereby has closed flux loops and the two layers switch their magnetizations simultaneously during switching operations. Parkin notes that sub-micron dimensions are needed to be competitive with DRAM memories in the range of 10-100 Mbit capacities. Parkin also notes that such small sizes are associated with significant problems, particularly super-paramagnetism, which is the spontaneous thermal fluctuation of magnetization in samples of ferromagnetic material too small to have sufficient magnetic anisotropy (a measure of the ability of a sample to maintain a given magnetization direction). To overcome the undesirable spontaneous thermal fluctuations in MRAM cells with very small cross-sectional areas, it is necessary to make the magnetic layers thick. Unfortunately, the size of the switching field increases with layer thickness, so the price paid for a thermally stable cell is the necessity of expending a great deal of current to change the magnetic orientation of the cell's free layer.

Some degree of anisotropy is necessary if an MTJ cell is to be capable of maintaining a magnetization direction and, thereby, to effectively store data even when write currents are zero. As cell sizes have continued to decrease, the technology has sought to provide a degree of magnetic anisotropy by forming cells in a wide variety of shapes (eg. rectangles, diamonds, ellipses, etc.), so that the lack of inherent crystalline anisotropy is countered by a shape anisotropy. Yet this form of anisotropy brings with it its own problems. A particularly troublesome shape-related problem in MTJ devices results from non-uniform and uncontrollable edge-fields produced by shape anisotropy (a property of non-circular samples). As the cell size decreases, these edge fields become relatively more important than the magnetization of the body of the cell and have an adverse effect on the storage and reading of data. Although such shape anisotropies, when of sufficient magnitude, reduce the disadvantageous effects of super-paramagnetism, they have the negative effect of requiring high currents to change the magnetization direction of the MTJ for the purpose of storing data.

Another way to address the problem that high currents are needed to change the magnetization direction of a free layer when the shape anisotropy is high, is to provide a mechanism for concentrating the fields produced by lower current values. This approach was taken by Durlam et al. (U.S. Pat. No. 6,211,090 B1) who teach the formation of a flux concentrator, which is a soft magnetic (NiFe) layer formed around a copper damascene current carrying line. The layer is formed around three sides of the copper line which forms the digit line at the underside of the MRAM cell.

In conventional MRAM design, both the word and bit lines that intersect at the location of a particular MRAM cell must be carrying currents in order for that selected cell to be switched and for a 0 or a 1 to be written thereon. For the large number of other cells that lie along only the current carrying bit line, or along only the current carrying word line, but not at their intersection, only the field of a single line is experienced. Such cells are called half-selected. In an MRAM array, the half-selected cells must not be switched and the selected cell must be switched.

Every cell in an array can be thought of as being potentially under the influence of the superposition of two magnetic fields. Ideally, if only one line is carrying current, the local field at the cell position should be insufficient to switch the cell and the cell can be said to be in the un-switched zone of the local magnetic field. A problem arises, however, because variations in cell formation, particularly when cells are extremely small, can allow a cell to switch even when it is in the un-switched zone of the local magnetic field.

The purpose of the present invention is to create a design margin for each cell, so that individual variations in cell structure would be insufficient to place a non-selected cell within the switched zone of its local magnetic field. Such a design margin can be achieved if the magnetization of a cell can be locked into a highly stable "C" state after each act of writing on the cell (holding it in a stable state during write operations on other, nearby, cells), and if the cell can then be placed into a less stable "S" state when it is actually being written upon. In the method of the present invention, the capability of a free layer to be placed into C or S states is provided by magnetostatically coupling it to a soft magnetic layer (a cladding layer) formed around a bit line and by building in a small amount of magnetic anisotropy into the free layer. This additional magnetostatic interaction, along with the conventional magnetic fields produced by currents in the word and bit line, produces two states of flux closure within the free layer, which are the C and S states that are desired.

Cladding layers surrounding current carrying write lines have been taught by others. Bloomquist et al. (U.S. Pat. No. 6,661,688 B2) teaches a write line structure in which a cladding layer nearly completely surrounds a write line below a memory storage device. The cladding layer has an open space above the write line, so that it effectively forms two poles immediately adjacent to the storage device. The structure is said to provide a greater field at the storage device for a given current in the write line.

Bhattacharayya et al. teaches an array of magnetic memory cells which are written upon by segmented write lines. The line segments are each cladded with high permeability, soft magnetic material to increase their magnetic fields for given currents.

Sharma et al. (U.S. Pat. No. 6,593,608 B1) uses a cladded bit line to serve as a seed layer for the formation of a soft magnetic reference layer (ie a pinned layer) within a double reference layer magnetic memory cell.

Jones et al. (U.S. Pat. No. 6,555,858 B1) discloses a self aligned clad bit line structure formed within a trench.

Rizzo (U.S. Pat. No. 6,430,085 B1) teaches a method of forming a cladding layer of magnetic material so that the layer has a shape anisotropy parallel to the conducting line that it clads and also has an induced anisotropy that is not parallel to the shape anisotropy. The combination of the two anisotropies enhances the permeability of the layer, thereby increasing the magnetic field for a given current.

Although all of the foregoing cited prior art teaches the use of a magnetic cladding layer for the purpose of enhancing the magnetic fields used for switching an MRAM cell, none of the prior art teaches the use of such cladding to magnetostatically couple to a free layer so as to create states of greater and lesser stability.

SUMMARY OF THE INVENTION

A first object of this invention is to provide an MTJ MRAM cell and an array of such cells, that have states of free layer magnetization which have increased stability against unintended switching by thermal agitation and by the ambient fields of nearby write lines.

A second object of this invention is to provide an MTJ MRAM cell and an array of such cells, which are more stable against switching of free layer magnetization when not selected (ie unintended switching) to be written on but which can be rendered less stable when they are actually being written upon.

A third object of this invention is to provide a word and bit line configuration and a current scheme within these lines that can produce more stable and less stable magnetization states and can switch the magnetization state of an MRAM cell free layer.

These objects will be achieved by a novel MRAM cell design in which variations in free layer magnetization stability as a function of selected or non-selected writing is achieved by the use of a composite bit line in which the current is carried by layers of high conductivity material, and the layers are clad by an adjacent layer formed of a thin, soft-magnetic material (a "soft adjacent layer" or SAL) which provides magnetostatic coupling with the free layer.

Referring to schematic FIG. 1a, there is shown a cross-sectional view (in the xz plane) of an MTJ cell (50) placed between crossing word and bit lines. The word line (10) runs in y-direction (out of the figure plane), the bit line (20) runs in the x direction and the layers of the cell are stacked in the z-direction. The bit line is formed as upper (22) and lower (26) conducting layers, with a layer of soft magnetic material (24) (the SAL) between them. The lower layer (26) can be present or absent. The word line (10) is shown formed of two portions, a conducting layer (43) and a soft magnetic cladding layer (44). The cladding layer on the word line may be present to enhance the word line's magnetic field, but its presence or absence is not a part of the present invention. As will be discussed more fully below, the cell includes a seed layer (30), an antiferromagnetic pinning layer (32), a pinned layer (34), an insulating tunneling barrier layer (36), a free layer (38) a capping layer (40) and a read word line (42), whose operation is not an important part of the invention. The pinned layer can be a synthetic ferrimagnetic layer or it can be a single layer.

FIG. 1b shows, schematically, an overhead view of two MTJ cells (50, 51) formed, respectively, between two parallel upper word lines (10, 11) and a single common lower bit line (20). The shape of the cell, in horizontal cross-section as shown, has a larger radius of curvature at its bottom portion (7) than at its upper portion (9), giving it a somewhat triangular shape. This asymmetry of shape produces a magnetic anisotropy in the free layer of the cell, so that the magnetization at the upper narrow portion (9) is more easily changed than that of the lower, broader, portion (ie., the self-demagnetization field at the broader lower portion is higher than at the narrower upper portion). This shape anisotropy is important in helping to create the two states of the free layer when the layer couples magnetostatically with the magnetization of the SAL. In the figure, cell (50) beneath word line (10) has its free layer magnetization in a locked C state, cell (51) beneath word line (11) has its free layer in an unlocked S state. The three arrows within the cells (50) and (51), denote the magnetization directions within the upper portion (19), the most substantial central portion (18) and the lower portion (17) of the free layer. The arrow drawn within the bit line (21) represents a magnetic field in the SAL, which was presumably induced by current in word line (10) in the −y direction. The direction of this magnetic field is used to lock or unlock the magnetization state of the free layer (as will be explained in greater detail below) so that a current in the bit line can reverse it. The particular upper and lower arrow directions (19) and (17) in the unlocked free layer (51) make the magnetization directional switch of the central magnetization (18) much easier.

The SAL will be magnetized in the −x direction when the current in the word line is in the y-direction, and will be magnetized in the +x direction when the current in the word line is in the −y direction. Because the SAL extends along the x-axis direction of the bit line, its magnetization tends to line up along this direction. Thus, when there is current in the bit line (the +x-direction), which by itself produces a magnetic field in the y-direction, the magnetic field in the SAL has both x- and y-components.

Referring to FIG. 2, there is shown a bit line (20) within which there is an outlined region (60) that is just below an MTJ cell. The free layer of the cell (38) is shown above the bit line and is magnetized (arrow) along its easy-axis direction (+y). Three-dimensionally, the free layer would be vertically (the +z direction) directly above the region of the bit line (60). In the absence of any other fields induced within the SAL, the magnetization of the free layer (up-arrow) would create a mirror image magnetized region (down-arrow) within the SAL by magnetostatic coupling. However, the region (60) of the SAL is magnetized in the direction shown (a slight negative y-component) by the arrow within it due to the combination of the field produced by the word line (+x) and the magnetostatic coupling of the SAL to the free layer magnetization.

Within the parameters of this design both the free and pinned layers can be a single ferromagnetic layer or a synthetic ferrimagnetic layer. The additional SAL is formed on the bit line and is patterned with it. The soft magnetic material of the SAL can be Ni, Fe, Co and their alloys, while the conducting material can be high conductivity materials such as Al, Cu, Au, Ru, Ta, CuAu or Rh. The switching current flows substantially through the high conductivity material, so the SAL can be made very thin.

FIG. 3 shows schematic graphs of word line current $I_w$ and bit line current, $I_b$, as a function of time during and just after a rewriting process applied to a particular cell. In the description of the preferred embodiment below, this figure will be explained in greater detail with further amplification by the free layer magnetization states of FIG. 4a-d. We will assume the word line lies along the y-axis and a positive value of its current, $I_w$, is in the −y (negative-y) direction. The bit line and the SAL formed on it, lie along the x-axis direction. We also assume that the cell is already in a stable C state, because it had previously been written on.

During a first portion of the rewrite process, after time $t_1$, there is a positive current in the word line but no current in the bit line. The current in the word line induces a magnetic field in the SAL that is in the +x direction. This is true for every cell that is below the active word line. The induced SAL magnetization couples with the easy axis magnetization of the free layer, which we will assume is also in the +y direction, and tilts it vertically, changing its state from stable C, to less stable S. The cell is now unlocked and ready to be written on.

To write on the unlocked cell, the bit line is activated at time $t_2$ and there is simultaneously current in both the word and bit lines at the location of the selected cell. Because it is in the S state, the small orthogonal magnetic field produced by the bit line current is sufficient to switch the free layer magnetization of the selected cell. Note that when in the C state, the magnetic stability of the free layer prevents it from being switched with the currents typically carried by word and bit lines.

After switching, the word line current is reduced and reversed in direction and the bit line current is turned off. The interval during which the word line current is reversed, but the bit line current is off, after $t_4$, changes the free layer magnetization to the C state. At the same time, all the cells beneath the word line that were unlocked but not rewritten are now restored to their C states.

Because of the shape induced magnetic anisotropy of the free layer, the small reversed current in the word line only changes the magnetization of the free layer at its upper portion, which causes the switch from S to C state. Finally, both currents are off and the magnetization reverts to the easy axis direction. Note that the switching from C to S and from S to C occurs when only the word line is activated. The switching of the magnetization direction occurs only when both word and bit lines are activated. The process just described will be discussed in greater detail below within the description of the preferred embodiment and with reference to FIGS. 4a-d.

The SAL plays several roles in the invention. First, because of its high permeability, the SAL concentrates the magnetic field produced by the current in the bit line and the proximity of the SAL to the free layer makes the enhanced field extremely effective in switching as a result of magnetostatic coupling between the SAL and the free layer. Second, the SAL creates a magnetostatic coupling anisotropy and maintains C and S states for the free layer magnetizations of all cells, even when the bit line carries no current.

As was already seen in schematic FIG. 2 and discussed above, the magnetized region (60) of the SAL beneath a particular asymmetric MRAM cell free layer (38) tends to have its magnetization line up tilted relative to the bit line (20) direction when the magnetic field in the bit line is in the direction of the solid arrows (x-direction). The cell free layer has both a built-in shape anisotropy because of its approximately triangular cross-section, and also an induced interaction anisotropy due to its magnetostatic coupling to the SAL beneath the cell. This interaction anisotropy is controlled by $M_s t$ (product of magnetic moment and thickness) of the free layer and the SAL and the spacing between them. This interaction anisotropy can be precisely controlled by the fabrication process. During the writing process the word line write current generates a magnetic field along the bit line which will line up the magnetization of the SAL under the free layer in that same direction. The magnetization of the SAL will rotate the magnetization of the free layer towards that direction. Then a small bit line current will rotate the magnetizations of the SAL and free layer in opposite directions. Removing the write current and then the bit line current in sequence will leave the magnetizations of the free layer and SAL layer coupled by their mutual dipole interaction with the magnetization of the free layer controlled by the direction of the bit line current. To help maintain the free layer magnetization in the y direction, the shape anisotropy has been introduced into the cell during fabrication by giving the cell its slight triangular shape, as shown. Alternatively, some anisotropy can be given to the cell free layer during the anneal to set the pinned layer magnetization.

Using the dipole-dipole interaction as a model for the magnetostatic coupling between the free layer and the SAL, it can be shown that the interaction anisotropy, $K_{in}$, is proportional to:

$$K_{in} \propto M_s(SAL) \times M_s(free) \times t_{SAL} \times a^2 \times r^{-3}$$

where a is the diameter of the cell, $t_{SAL}$ is the thickness of the SAL, r is the distance between the free layer and the cell, and $M_s$ is the magnetic moment. The extreme sensitivity (inverse third power) to r shows that the bit line needs to be thin and close to the free layer. Also, because it is the bit line current that is responsible for the switching, the current must be substantially in the highly conductive bit line layer. If it is desired to reduce the interaction anisotropy, the deposition process induced anisotropy and/or the shape induced anisotropy can be set along the bit line direction (x), since these anisotropies subtract from the interaction anisotropy. Finally, an alternative design to enhance the word line field efficiency would be to add a magnetic cladding layer over the word line on the side away from the cell.

DESCRIPTION OF THE PREFERRED EMBODIMENT

The preferred embodiment of the present invention provides an MTJ MRAM cell and its method of use, or an MRAM array of such cells, in which the required switching current in the bit line can be reduced, the bit state of the cell rendered thermally stable between writing and rewriting and the cells can be locked or unlocked in accordance with whether or not they have been selected to be written upon, all by the addition of a thin adjacent soft magnetic layer formed on the bit line which couples magnetostatically to a proximal free layer of the MTJ cell. The preferred embodiment also teaches a sequence of word and bit line currents that rewrite the MTJ MRAM cells in accord with the objects of the invention.

Figure 1A:
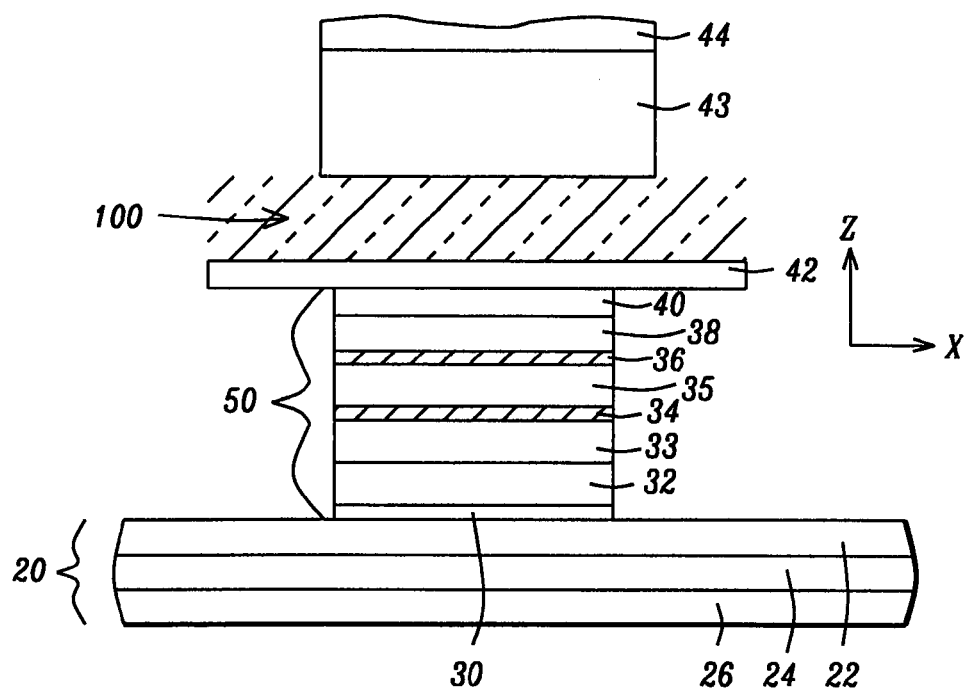
FIG. 1a shows, schematically, a vertical cross-section of an MTJ cell formed between a word line and a bit line with a SAL.

Referring back to FIG. 1a there is shown in a schematic vertical cross-sectional view (in the xz-plane) the general configuration of the MRAM cell of the present invention. The MTJ element (50), which can have a horizontal cross-sectional shape to provide a magnetic anisotropy (and in this embodiment is given a somewhat curved triangular shape), is situated at a junction between a horizontal word line (20), which is above the cell and runs out of the plane of the figure (in the y-direction), and a horizontal bit line (30), which is below the cell and runs in a direction (the x-direction) perpendicular to the word line. The cell layers are stacked vertically in the z-direction. The combination of the MTJ element and the word and bit lines that access and switch the cell form an MTJ MRAM cell.

The bit line is a composite layer formed as upper (22) and lower (26) conducting layers, with a layer of soft magnetic material (24) (the SAL) between them. The conducting layers carry substantially all of the bit line current. As will be discussed more fully below, the cell includes a seed layer (30), an antiferromagnetic pinning layer (32), a pinned layer, which in this embodiment is a synthetic ferrimagnetically coupled layer comprising a second (33) and first (35) ferromagnetic layer coupled by a non-magnetic conducting layer (34), an insulating tunneling barrier layer (36), a free layer (38), which can be a multilayer, a capping layer (40) and a read word line (42), whose operation is not an important part of the invention. The pinned layer can be a synthetic ferrimagnetic layer or it can be a single layer.

The bit line typically is formed in a trench in a dielectric layer over a silicon substrate, but those details are not shown and are not necessary to explain the preferred embodiment. The conducting layers (22 and 26) of the bit line are formed of a non-magnetic high conductivity material, such as Cu, Au, Al, Ag, CuAg, Ta, Cr, NiCr, NiFeCr, Ru, Rh and their multilayers and alloys. Since the upper layer (22) separates the SAL from the free layer of the cell, it must be as thin as possible, less than 1000 angstroms, for optimal coupling between the SAL and the free layer. In addition, the width of the bit line should be greater than 50% of the lateral dimension of the cell. The lower conducting layer (26) can have a thickness between 0 and 1000 angstroms, the zero value indicating that it can be omitted. If the lower layer is present, a larger bit line current is required, but the line has a lower resistance and superior signal-to-noise ratio. The SAL is formed of soft (low coercivity) and highly permeable magnetic material such as alloys of Co, Ni and Fe and has a thickness between approximately 30 and 500 angstroms which should be less that 5 times the thickness of the free layer. A seed layer (30) is formed on the bit line and promotes the high quality crystalline formation of subsequently formed layers of the cell. The seed layer can be a layer of NiCr, NiFeCr or NiFe formed to a thickness between approximately 20 and 100 angstroms. A single pinned layer or, as in this embodiment, a synthetic ferrimagnetic pinned layer is formed on the seed layer. The antiferromagnetic layer (32) pins the magnetization of the second ferromagnetic layer (33) unidirectionally and the second ferromagnetic layer is magnetized in an antiparallel direction to that of the first layer (35). The first and second ferromagnetic layers are layers of CoFe or CoFeB formed to thicknesses between approximately 10 and 100 angstroms and matched so that the net magnetic moment of the configuration is substantially zero. The coupling layer (34) is a layer of Rh, Ru, Cr or Cu of proper thickness to maintain strong antiparallel coupling. The antiferromagnetic pinning layer (32) can be a layer of PtMn, NiMn, OsMn, IrMn, NiO or CoNiO of thickness between approximately 40 and 300 angstroms.

A tunneling barrier layer (36) is formed on the first ferromagnetic layer (35) of the pinned layer. This layer is a layer of insulating material such as oxidized Al or an oxidized Al—Hf bilayer and is formed to a thickness between approximately 7 to 15 angstroms. A ferromagnetic free layer (38) is formed on the barrier layer. At this stage of the cell fabrication, it is important to note that the vertical spacing between the SAL and the free layer should less than ⅕ the lateral dimension of the free layer. The free layer can be a single layer of ferromagnetic material, such as a layer of CoFe, CoFeB or NiFe formed to a thickness between approximately 10 and 100 angstroms or it can be a multilayer, comprising first and second ferromagnetic layers, magnetized in antiparallel directions and separated by a spacer layer of non magnetic but conducting material such as Rh, Ru, Cr or Cu, which is of the proper thickness to maintain strong antiparallel coupling between the two ferromagnetic layers. A capping layer (40) is formed on the free layer. The capping layer can be a layer of Ru, or Ta formed to a thickness between approximately 10 and 1000 angstroms.

After the deposition of the capping layer, the MRAM cell is patterned to produce a uniform horizontal cross-section which is triangular with rounded vertices or distorted circular with a large difference between upper and lower radii of curvature. As has been noted, this shape asymmetry of the cell produces a corresponding magnetic anisotropy in the free layer that promotes a two state magnetostatic interaction with the SAL. It is also possible to provide an appropriate magnetic anisotropy to the free layer during the annealing that antiferromagnetically pins the pinned layer.

A layer of insulating material (100) surrounds the cell and separates the upper portion of the cell from the word line. It is noted that the word line is a layer of conducting material less than 100 nm in thickness and may be augmented with a cladding layer (44) of magnetic material formed on its surface away from the cell.

Figure 3:
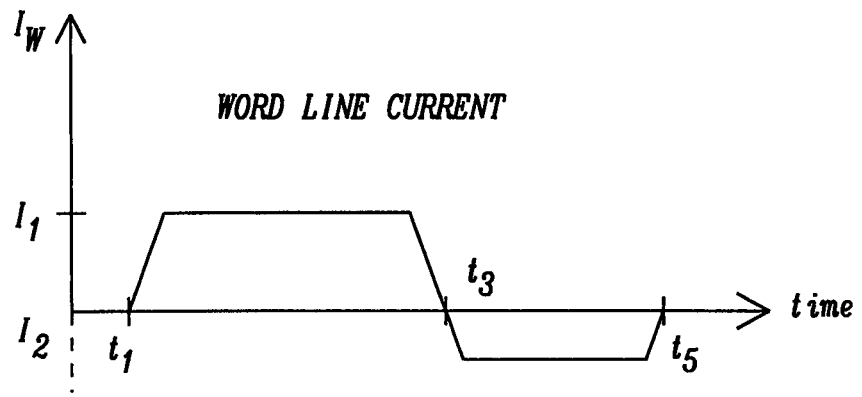
FIG. 3 shows, schematically, graphs of current vs. time for word line and bit line currents during a write process on a cell.
Figure 3:
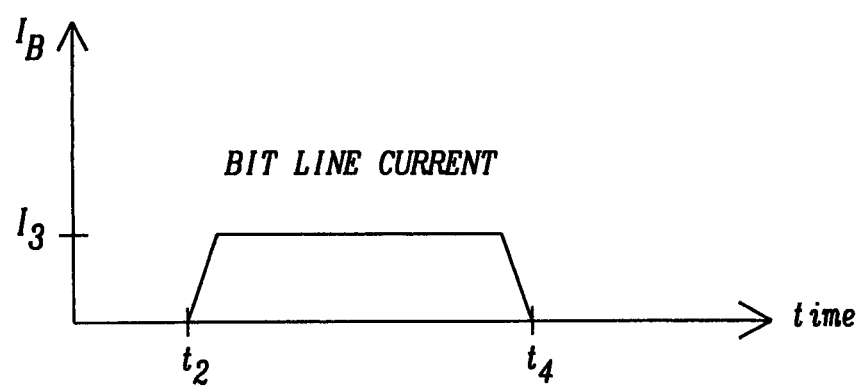

As has already been noted, the cell and cell array formed in accordance with the preferred embodiment may be used to achieve the objects of the invention (ie., locking, unlocking and state switching) by a particular sequence of currents in the word and bit lines. Referring to FIG. 3, there is shown a preferred sequence of word line and bit line currents that will achieve the objects of the present invention when used with the MTJ MRAM cell of the present invention. Referring also to FIGS. 4a-d, there are shown states of the free layer corresponding to the currents in the word and bit lines of FIG. 3.

Figure 1B:
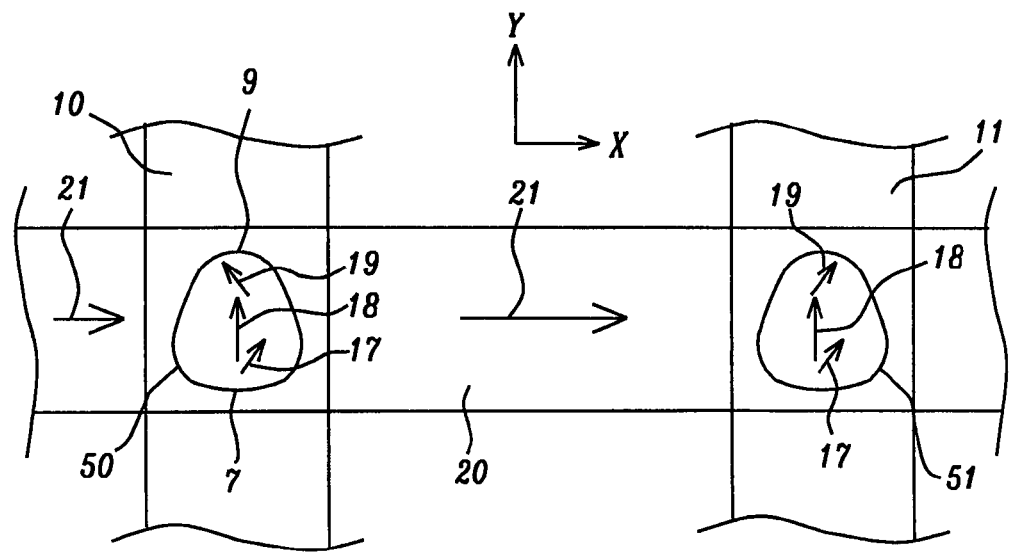
FIG. 1b shows, schematically, an overhead view of two cells formed beneath parallel word lines and a single common bit line formed beneath them.
Figure 2:
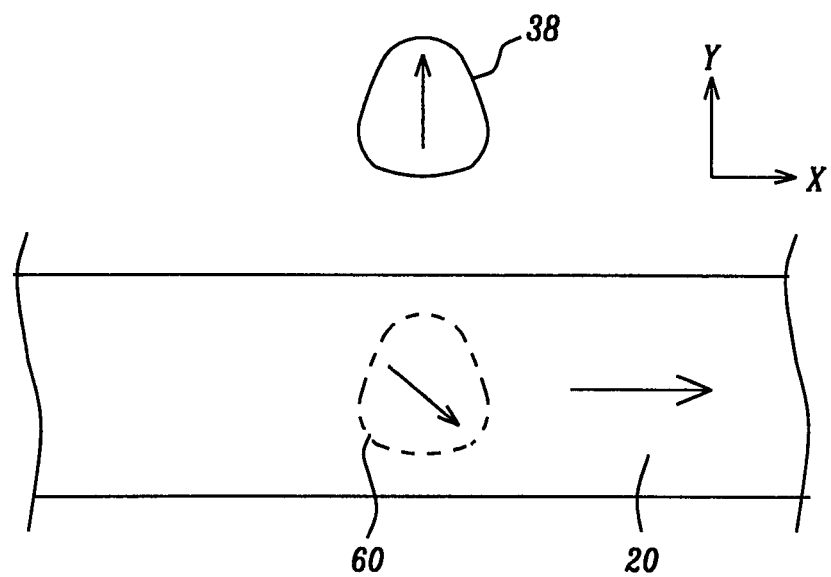
FIG. 2 shows, schematically, a SAL and an MTJ cell free layer above it, showing the magnetizations in the free layer and in the region of the SAL just beneath the cell.

To understand the operation of the current sequence, we will assume that a certain cell has already been written upon and is presently storing, in a stable C state, a particular bit of information (a logical 1 or 0), corresponding to a particular magnetization state of the free layer. The cell denoted (50) in FIG. 1b, is an example of such a cell. The state of the cell's free layer is also shown schematically in FIG. 4a. The central arrow (18) in the cell pointing along +y, represents the substantial magnetization direction of the cell produced by its magnetostatic coupling to the SAL. The smaller arrows at the top (19) and bottom (17) of the cell represent local magnetization at the upper and lower edges and stabilize the cell against unwanted switching of the central arrow. The present C state of the cell, therefore, has guaranteed that it could not have been improperly switched (ie., half-selected) by magnetic fields not directly addressing the cell prior to the present writing process.

The cell is now selected so that it can be rewritten, ie, that its present state of magnetization can be changed. The sequence of currents required for this process must first place the cell into a less stable S state, so that its magnetization direction can be switched, then its magnetization is switched, then, finally, it is placed, once again, into the more stable C state so that it remains thermally stable until it is selected again at some later time.

Figure 4:
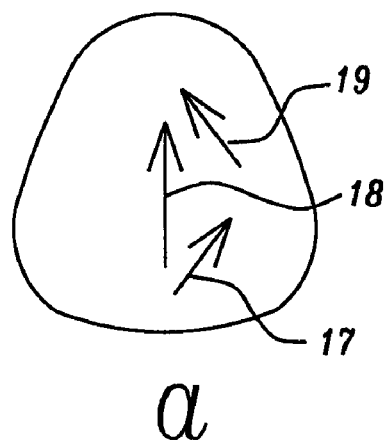
FIGS. 4a-d show the magnetization of a selected free layer as a function of word and bit line currents shown in FIG. 3.
Figure 4:
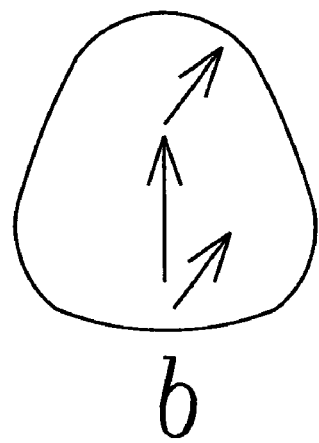
Figure 4:
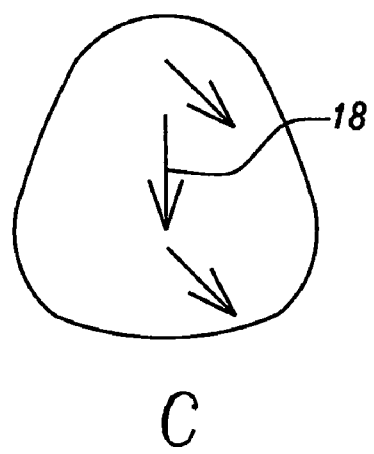
Figure 4:
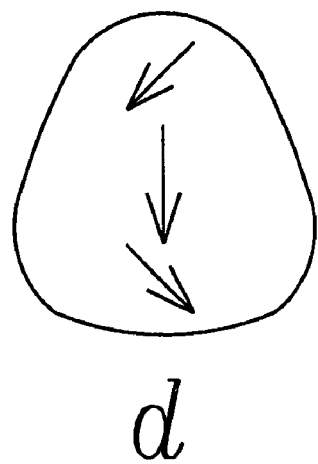

During a first portion of the rewrite process, shown in FIG. 3, there is a current in the word line, beginning at a time $t_1$, and in a first direction (called a positive current). For ease of visualization, we will call this first direction, which is the positive current, the −y direction (see FIG. 1b for the appropriate directions). There is as yet no current in the bit line. The current in the word line induces a magnetic field in the SAL that is in the +x direction. This is true for every cell that is below the active word line. The induced SAL magnetization couples with the magnetization of the free layer, and is sufficient to rotate the upper magnetization (19) horizontally (clockwise) towards the +x direction, changing its state from stable C, to less stable S. This configuration is shown in FIG. 4b. Note that the shape anisotropy of the cell makes only the magnetization of its narrow upper portion easy to shift clockwise, towards +x. The cell is now unlocked and ready to be written on.

To rewrite the now unlocked cell, the bit line is activated at time $t_2$ of FIG. 3 with a current in the +x direction and there is then simultaneously current in both the word and bit lines at the location of the selected cell. Because it is in the S state, the small orthogonal magnetic field produced by the bit line current is sufficient to switch the free layer magnetization (18) of the selected cell to the −y direction. The switched state is shown in FIG. 4c. Note that when it was originally in the C state (FIG. 4a), the magnetic stability of the free layer prevents it from being switched with the currents typically carried by word and bit lines.

After switching, the word line current is reduced so that beginning at $t_3$ its current is constant and reversed (but of small magnitude) in direction to the +y direction. This current reversal is sufficient to switch the direction of the upper magnetization of the free layer, but not the lower magnetization, so that the free layer is placed in a C state (FIG. 4d). Because of the shape induced magnetic anisotropy of the free layer, the small reversed current in the word line only changes the magnetization of the free layer at its upper portion, which causes the switch from S to C state. Finally, the bit line current is turned off at $t_4$ and the word line current is turned off at $t_5$, leaving the free layer with its magnetization now in the −y direction and in a stable C state which is maintained by the magnetostatic interaction with the SAL. Note that the switching from C to S and from S to C occurs when only the word line is activated. The switching of the magnetization direction occurs only when both word and bit lines are activated.

As is understood by a person skilled in the art, the preferred embodiment of the present invention is illustrative of the present invention rather than being limiting of the present invention. Revisions and modifications may be made to methods, processes, materials, structures, and dimensions through which is formed an MTJ MRAM cell or an MRAM array of such cells, having a composite bit line with an adjacent soft magnetic layer that couples magnetostatically to the cell free layer to make it thermally stable and capable of being locked or unlocked in accordance with whether or not it has been selected to be written upon, while still providing such an MTJ MRAM cell or array of such cells, formed in accord with the present invention as defined by the appended claims.

The invention claimed is:

1. A method of selecting and writing on an MTJ MRAM cell having free layer magnetization states of greater and lesser stability in each of two opposite directions and said cell being in an initial magnetized state of greater stability in one of said two directions, comprising:

providing a substantially constant current, $I_1$, having a first direction and a first magnitude in a word line formed above said cell, said current beginning at a time $t_1$, and said current placing said cell in a state of lesser stability while leaving said magnetization direction unchanged;

providing a substantially constant current having a second direction, which is orthogonal to said first direction and a second magnitude, $I_2$, in a bit line formed orthogonally to said word line below said cell, said current beginning at a time $t_2$ wherein $t_2$ is greater than $t_1$ and said current reversing the direction of the magnetization of said cell;

providing, in said word line at a time $t_3$, which is greater than $t_2$ a substantially constant current having a third direction, which is opposite to said first direction and a third magnitude, $I_3$, in said word line, said current placing the free layer of said cell in a state of greater stability, while leaving its magnetization direction unchanged;

reducing the current in said bit line to zero at a time $t_4$ which is greater than $t_3$;

reducing the current in said word line to zero at a time $t_5$, which is greater than $t_4$, whereby said free layer is in a state of greater stability with a magnetization direction that is opposite to that of said initial magnetized state.

2. The method of claim 1 wherein $I_1$ is between approximately 1 and 10 mA, $I_2$ is between approximately 0.5 and 5 mA and $I_3$ is between approximately 0.2 and 2 mA.

* * * * *